United States Patent [19]

Sado

[11] 4,252,391
[45] Feb. 24, 1981

[54] ANISOTROPICALLY PRESSURE-SENSITIVE ELECTROCONDUCTIVE COMPOSITE SHEETS AND METHOD FOR THE PREPARATION THEREOF

[75] Inventor: Ryoichi Sado, Saitama, Japan

[73] Assignee: Shin-Etsu Polymer Co., Ltd., Japan

[21] Appl. No.: 49,977

[22] Filed: Jun. 19, 1979

Related U.S. Application Data

[60] Division of Ser. No. 911,418, Jun. 1, 1978, which is a continuation-in-part of Ser. No. 743,920, Nov. 22, 1976, abandoned.

[51] Int. Cl.³ .................... B32B 7/00; H01C 10/10
[52] U.S. Cl. ........................... 339/60 R; 428/119; 339/60 C; 339/61 R; 174/69; 174/73 SC; 174/98; 338/13; 338/47; 338/99; 338/114; 338/220
[58] Field of Search ................... 428/119, 120, 86, 90

[56] References Cited
U.S. PATENT DOCUMENTS
3,359,145  12/1967  Salyer .................................. 156/331

Primary Examiner—Marion McCamish
Attorney, Agent, or Firm—McGlew and Tuttle

[57] ABSTRACT

Anisotropically pressure-sensitive electroconductive composite sheets are provided which have a very low electric conductive resistance in the direction perpendicular to the plane of the sheet when compressed with an adequate pressure in the direction but a high insulating resistance in all directions within the plane of the sheet. The composite sheets are constructed so that electrically conductive fibers are uniformly dispersed in the matrix of an electrically insulating substance, the average length of the fibers ranging from 20 to 80% of the thickness of the sheet, and are aligned in the direction substantially perpendicular to the plane. They are useful as a switching material in various miniaturized electronic circuits.

2 Claims, 4 Drawing Figures

ANISOTROPICALLY PRESSURE-SENSITIVE ELECTROCONDUCTIVE COMPOSITE SHEETS AND METHOD FOR THE PREPARATION THEREOF

CROSS REFERENCE TO RELATED APPLICATION

This application is a division of application Ser. No. 911,418 filed June 1, 1978 which is a continuation-in-part of application Ser. No. 743,920, filed Nov. 22, 1976 now abandoned.

BACKGROUND OF THE INVENTION

1. Field of the Invention

The present invention relates to an anisotropically pressure-sensitive electroconductive sheet. In particular, the invention relates to an anisotropically electroconductive sheet having a volume resistivity as measured in a direction within the plane of the sheet much larger than the volume resistivity as measured in the direction perpendicular to the plane of the sheet when a pressure is applied in the direction perpendicular to the plane.

2. Description of the Prior Art

In the prior art there are known various electrically conductive plastics and elastomers prepared by uniformly dispersing various kinds of electrically conductive powders or fibers, such as metal powders, carbon black, graphite powder, carbon fibers and the like in various kinds of electrically insulating plastics or elastomers as the matrix. In particular, researches have been directed to the possibilities of obtaining anisotropically electroconductive materials based on the electrically conductive plastics or elastomers, which can find specific uses, for example, as electric contact materials in certain electronic circuits.

The prior art anisotropically electroconductive materials have been prepared by the following methods, particularly in a sheet-like form.

According to one example, a plurality of sheets of an electrically conductive material and a plurality of sheets of an electrically insulating material are stacked together alternately one on top of the other, pressed together, and bonded into a block. The resultant block is sliced with parallel planes perpendicular to the plane of the stacked sheets to form striated sheets. These sheets have accordingly anisotropic electroconductivity, that is, they are conductive in the direction perpendicular to the plane of the sheet but insulating in the direction perpendicular to the direction of striation within the plane of the sheet.

According to another example, an elastomeric sheet of a rubbery material is impregnated with metal particles in a relatively small amount such that the impregnated material per se can not be electrically conductive. The resultant sheet is then employed as the anisotropically electroconductive material. When the sheet thus obtained is pressed perpendicularly on the surface, the metal particles dispersed in the matrix come into contact with each other in the direction of pressing to form pressure-sensitive electrical contact in the direction perpendicular to the plane of the sheet, while no electrical contact is formed in the directions within the plane of the sheet. One example of this product is "CHO-NECTOR", product of Chomerics Inc., U.S.A.

These anisotropically electroconductive sheets of the prior art are used widely in various kinds of electronic devices as a contact material for rapidly connecting electronic circuits with high fidelity, such as, lead wire-free integrated circuits and hybrid circuits, connection of a flexible circuit and the terminals of a printed circuit as well as an interconnector between a display unit of liquid crystals or a light emitting diode in pocketable electronic calculators, electronic watches or the like and a circuit board.

These prior art sheet materials with anisotropic electroconductivity, however, cannot be free from several problems. For example, the anisotropically electroconductive materials prepared according to the first example described above have disadvantages in high costs of manufacture and difficulties in manufacturing technology, especially when designed for use as the connection for multi-circuits or closely spaced circuits, along with the fact that the number of circuits connected therewith is limited by the number of the layers of the electrically conductive material. In addition, they are defective in that insulation breakdown in the layers of the electrically insulating material tends to take place when the sheet material is designed for use in the connection of closely spaced circuits.

The anisotropically electroconductive sheets obtained according to the second example described above have disadvantages in that insulation resistance between the circuits sometimes becomes unduely low owing to contacting pressure to form anisotropical electric contact points. Furthermore, the reliability in electric contact between circuits is insufficient when the sheets are intended for use in the connection with closely spaced circuits in a miniaturized device and accordingly are made very thin with decreased anisotropy.

SUMMARY AND OBJECTS OF THE INVENTION

It is, therefore, a primary object of the present invention to present an anisotropically pressure-sensitive electroconductive sheet-like material free from the foregoing disadvantages encountered in similar materials of the prior art. The anisotropically pressure-sensitive electroconductive sheet of the invention has a volume resistivity as measured in a direction within the plane of the sheet much larger than that as measured in the direction perpendicular to the plane of the sheet when an adequate pressure is applied in the direction. The sheet is composed of an electrically insulating substance as the matrix, such as organic polymeric substances or inorganic glasses, and electrically conductive fibers dispersed therein, the average length of the fibers ranging from 20 to 80% of the thickness of the sheet, and aligned in the direction perpendicular to the plane of the sheet.

The anisotropically electroconductive composite sheet of the present invention is prepared by the steps of:

(a) mixing an electrically insulating substance with plasticity capable of hardening and electrically conductive fibers uniformly, the average length of the fibers being reduced to an appropriate value by the shearing force in this step, (b) subjecting the thus obtained blend with plasticity to shearing deformation in one direction whereby the electrically conductive fibers are aligned in the direction parallel to the direction of the shearing deformation, to form a composite of the electrically insulating substance and the electrically conductive fibers, (c) subjecting the thus obtained composite to hardening, and (d) slicing the resulting hardened composite into a sheet with both sides substantially perpendicular to the direction of the alignment of the electrically conductive fibers.

The anisotropically pressure-sensitive electroconductive composite sheet of the present invention has a structure in which numberless fibers of an electrically conductive material are embedded in the matrix of the electrically insulating substance and aligned in the direction perpendicular to the plane of the sheet, the average length of them ranging from 20 to 80% or, preferably, 20 to 60% of the thickness of the sheet. The electrically conductive fibers aligned in parallel to each other are insulated from each other by the intervening insulating substance. Thus the sheet of the invention can be used not only as a contacting material for interconnectors between various kinds of electronic circuits where similar prior art material is applicable, but also as a contacting material for interconnectors in a closely distanced circuit of miniature size owing to the possibility of minumum contact areas of the electrodes and the minimum distance of the electrodes contacting on it, which have not been available with the prior art materials.

The preferred electrically insulating substance is a silicone rubber and the preferred electrically conductive fiber is carbon fiber. The anisotropically electroconductive sheets prepared from the combination of these two materials have a volume resistivity as determined in the direction perpendicular to the plane of the sheets with application of an adequate pressure at the same degree as determined with a usual electrically conductive carbon black-impregnated silicone rubber and a volume resistivity as measured in a direction within the plane of the sheets at the same degree sufficiently high as an insulator.

DETAILED DESCRIPTION OF THE PREFERRED EMBODIMENTS

Figure 1:
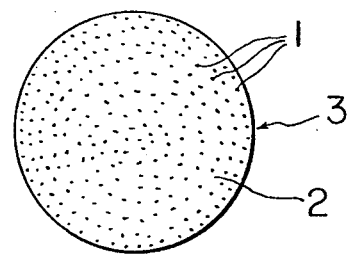
FIG. 1 is a plan view of the anisotropically pressure-sensitive electroconductive composite sheet of the present invention.

The electrically insulating substances useful as the matrix of the anisotropically electroconductive composite sheet in accordance with the present invention are exemplified by inorganic glasses, such as, soda-lime glass, borosilicate glass and fused quartz glass; thermoplastic polymeric materials, such as, polyesters, polyvinyl chloride, polymethyl methacrylate, polyolefins, polyamide resins, polyurea resins, polycarbonate resins, polyacetal resins and polystyrene; thermosetting resins, such as, unsaturated polyester resins, polyurethanes, organopolysiloxane resins, phenolic resins, urea-formaldehyde resins and guanamine resins; and rubbery polymers, such as, natural rubber and various kinds of synthetic rubbers including organopolysiloxane rubbers. Among the above-mentioned polymeric substances, the most preferred is an organopolysiloxane rubber or, in particular, room-temperature curable organopolysiloxane rubber capable of flowing before cure. These thermoplastic, thermosetting or rubbery polymers may be admixed, if necessary, with reinforcing or bulk-increasing fillers, plasticizers, pigments, dyes, solvents, curing agents, stabilizers, dispersing agents, lubricants, and other conventional additives.

The electrically conductive fibers to be included in the matrix of the above-mentioned insulating substances in accordance with the present invention are exemplified by carbon fibers, which are prepared by carbonizing or graphitizing various kinds of organic fibers, such as rayons, polyacrylonitrile fibers and polyvinyl alcohol fibers as well as fibers of petroleum pitches and phenolic resins; metal fibers; metal-plated synthetic or glass fibers; and those which are prepared from a fiber-forming polymeric substance with a conductivity-imparting agent. Among the above-mentioned electrically conductive fibers, carbon fibers and metal fibers are most preferred.

The thickness of the fiber is preferably less than 0.2 mm or, more preferably, 0.1 mm in diameter and any finest fibers available may be employed. In order to improve the dispersion of the fibers in the matrix material with increased surface affinity, it is recommendable that the surface of the fiber is treated in advance with certain dispersing aids before blending with the matrix material.

The preparation of the anisotropically pressure-sensitive electro-conductive composite sheets of the present invention is described as follows. The electrically conductive fibers are uniformly dispersed in the plasticized matrix of the electrically insulating substance by blending with a suitable blending machine, if necessary, under heating. The blending machine suitable for the purpose may be any of the conventional mixing rollers, Banbury mixers, kneaders and the like.

The length of the fibers to be blended with the matrix material is preferably less than 10 mm on the average before blending because longer fibers may bring about some difficulties in blending. In the course of continued blending, the fibers are cut by shearing force approximating the predetermined average length of the fibers which is determined in accordance with the intended thickness and the desired pressure-sensitiveness of the product sheets. During the course of the blending, small portions of the blend are taken at times to be examined microscopically for the average length of the fibers after dispersion in a suitable solvent and the blending is terminated when the average length of the fibers reached the predetermined value. When an anisotropically pressure-sensitive conductive sheet of 0.5 mm thickness is to be prepared, for example, the average length of the fibers at the finish of blending must be in the range from 0.1 to 0.4 mm although it may be somewhat larger in consideration of the further slight reduction of the average fiber length caused by slicing.

Volume ratio of the electrically conductive fibers and the electrically insulating substance as the matrix is determined depending on various factors, such as, the combination of the materials of the fibers and the matrix, diameter of the fibers, the degree of anisotropy in the electroconductivity of the resultant sheets, desired electroconductivity or pressure-sensitiveness thereof in the direction perpendicular to the plane of the sheet, and the like. It is, however, usually in the range from 0.1 to 20%, preferably 0.5 to 10% by volume of the fibers, based on the volume of the matrix material. Too high volume ratio of the fibers brings about decreased anisotropy in the electroconductivity, while too low volume ratio results in an insufficient electroconductivity in the direction perpendicular to the plane of the sheet even with an excessively large pressure applied on to the plane.

After the blending operation, the orientation of the fibers to achieve the alignment of the fibers in the matrix is carried out by the following. The blend above obtained, which is a uniform dispersion of the electrically conductive fibers in the matrix of the electrically insulating polymeric substance, is subjected to shearing deformation in a direction once or repeatedly whereby the fibers are brought into alignment in the direction of the shearing deformation, to give a composite with aligned fibers. Such a deformation process can be performed with various kinds of machines depending on the consistency and plasticity of the plasticized blend, such as, pumps including screw pumps, gear pumps, plunger pumps, and plastics or rubber processing machines including extruders, injection machines and calendering machines, depending on the plasticity of the blend. The degree of the fiber alignment can be examined visually with auxiliary electrical measurement, if necessary.

The composite above obtained with aligned electroconductive fibers is then shaped into desired forms, such as, rods, pipes, ribbons, boards and the like by extrusion so that the alignment of the fibers in the matrix is not disturbed. It is optional that a plurality of the rods or plates thus formed are further molded into a block by placing them in a mold with the direction of the fiber alignment in each rod or plate in one and the same direction, followed by pressing the thus assembled rods or plates in a direction perpendicular to the alignment of the fibers. By this means, any large sheets can be readily prepared by slicing the blocks to have sufficiently large cross section according to need.

The thus shaped composite with aligned fibers in the form of a rod, pipe, ribbon, board, block or the like is then subjected to the hardening process. When the electrically insulating polymeric substance as the matrix is a thermoplastic polymer, the composite can be hardened by merely cooling down to a temperature below the softening point of the polymer. When the matrix material is a thermosetting resin or a rubbery elastomer, hardening of the composite is achieved by the curing of the polymers at room temperature or at an elevated temperature according to the curing property of the polymer with or without the aid of the curing agent or the crosslinking agent admixed in the composite before blending.

The final step of preparation is to slice the hardened composite with the aligned electroconductive fibers into thin sheets with the surfaces substantially perpendicular to the direction of the fiber alignment. It is important that the sliced sheets have a thickness in a close interrelationship with the average length of the electroconductive fibers dispersed in alignment in the sheet. The volume resistivity of the sheet in the direction perpendicular to the plane of the sheet is a function of the thickness and increases as the thickness increases when the average length of the fibers is the same. Therefore, the electric conductive resistance between unit areas of the surfaces of a sheet increases rapidly as the thickness increases, finally reaching a value so large that no electric conduction can be obtained. Usually the thickness of the sheet is less than 5 times the average length of the aligned fibers before slicing in order to give sufficient electroconductivity for most applications. In other words, the average length of the fibers dispersed in the sheet in alignment is larger than 20% of the thickness of the sheet. When the average length of the fibers is smaller than 20% of the thickness of the sheet, the anisotropy in the electroconductivity is largely lost along with the increase in the resistivity itself of the sheet in the direction perpendicular to the plane of the sheet. When the average length of the fibers exceeds 80% or, in some cases, 60% of the thickness of the sheet, on the other hand, the pressure-sensitiveness in the electroconductivity of the sheet decreases though somewhat increased value of the conductivity itself with relatively small contacting pressures applied thereto. For example, almost no pressure-sensitiveness can be expected when the average length of the fibers approximates 100% of the thickness of the sheet or, namely, all of the fibers are extending from one surface of the sheet to the other.

It is advisable that, when the matrix substance is a thermoplastic resin, slicing is performed at an elevated temperature but below the softening point of the thermoplastic resin. When the matrix substance is a thermosetting resin, it is recommended that the composite with the aligned fibers is sliced before the resin becomes completely cured, to facilitate the slicing and the thus sliced sheets are subjected to post-cure to obtain final products.

Further, it is possible that one or more of the rods, ribbons, boards, blocks and the like of the composite, from which the sliced product is to be formed, are embedded in or coated with the same or different electrically insulating polymeric substance as or from the polymeric substance used as the matrix of the same composite, and the thus formed new composites with the circumambient insulating polymer are similarly sliced to give sheets having the surfaces perpendicular to the direction of the alignment of the fibers. These sheets have an anisotropically electroconductive portion or portions surrounded by the insulating regions or vice versa. In other words, a mozaic distribution of the anisotropically electroconductive areas and insulating areas is obtained within a sheet or an anisotropically electroconductive sheet having peripheral insulation is obtained.

Figure 2:
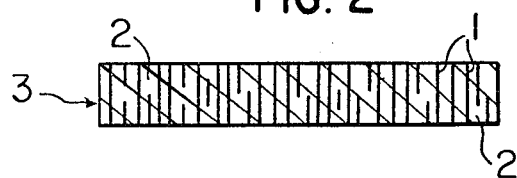
FIG. 2 is an enlarged cross-sectional view of the anisotropically electroconductive composite sheet of the present invention.

Now referring to FIG. 1 and FIG. 2, which show the anisotropically pressure-sensitive electroconductive composite sheet of the present invention by a plan view and an enlarged cross-sectional view, respectively, electrically conductive fibers 1 are uniformly distributed in the matrix 2 in alignment in the direction substantially perpendicular to the plane of the sheet contributing to the electroconductivity of the sheet in the direction of the alignment, while the fibers are isolated from each other by the intervening insulating polymeric substance as the matrix material, whereby no electroconductivity is given in the directions within the plane of the sheet. In FIG. 2, some of the fibers are extending from one surface of the sheet to the other while most of the fibers are not so long giving an average length of the fibers ranging from 20 to 80% of the thickness of the sheet. These shorter fibers contribute little to the electroconductivity of the sheet while they come into contribution to the electroconductivity when the sheet is compressed by applying a pressure in the direction perpendicular to the plane of the sheet.

Figure 3:
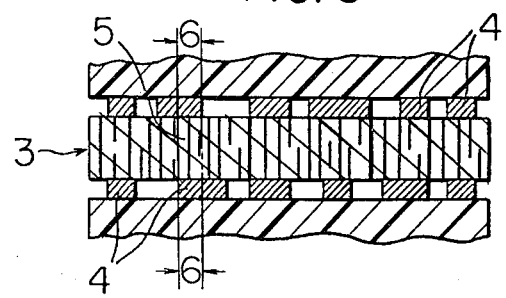
FIG. 3 is a cross-sectional view of a contacting element in accordance with the teachings of the present invention.

In FIG. 3 which is a cross-sectional view of a contacting element, contacting material 3 is the anisotropically pressure-sensitive electroconductive sheet of the present invention in contact with electrodes 4 at both sides of the sheet. In this assembly, reliable electrical connection is obtained between the two electrodes which are situated right opposite to each other, across the sheet by applying an adequate contacting pressure, while a sufficiently high insulating resistance is obtained between the electrodes situated on the same side of the sheet or between the electrodes situated on both sides of the sheet but not in the opposing position. When the opposing electrodes put on both sides of the sheet are not in direct facing on the whole areas of the electrodes, the electric conduction between the electrodes is obtained only in region 5 within the sheet, sandwiched by regions 6 of the electrodes in direct facing to each other.

Figure 4:
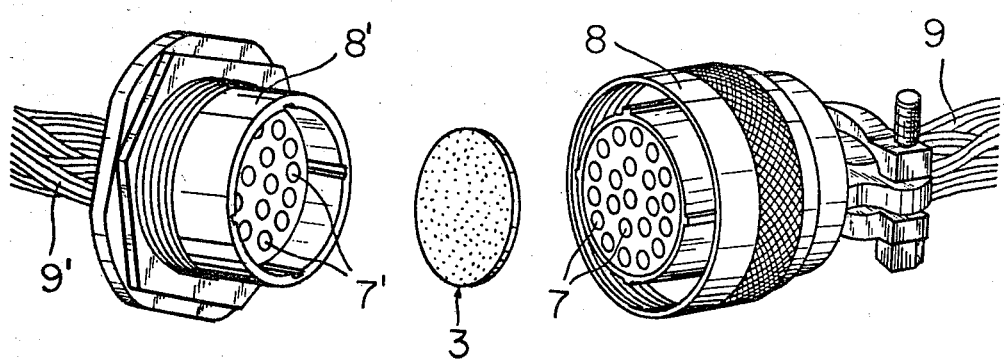
FIG. 4 is a perspective view of a disassembled pinless connector in accordance with the present invention.

FIG. 4 shows a disassembled pinless connector in a perspective view, which is an embodiment of the application of the anisotropically pressure-sensitive electroconductive composite sheet of the present invention. Therein, reference numeral 3 designates the anisotropically pressure-sensitive electroconductive sheet to be put between line terminals 7 and 7' as the material for contacting both line terminals mounted in the connector shells 8 and 8' at the ends of the electric cables 9 and 9', respectively.

The present invention will be more fully understood from the following illustrative example, in which parts are all parts by weight.

EXAMPLE

Into 100 parts of a commercially available silicone rubber compound KE 151U (a product of Shin-Etsu Chemical Co., Ltd., Japan) were added 6 parts of a commercially available carbon fiber TORAYCA T300A (a product of Toray Co., Japan) with a fiber diameter of 5 m or less chopped in advance about 3 mm long and 1.5 parts of a curing agent C-2 (a product of Shin-Etsu Chemical Co.) and the blend was milled in a mixing roll for a sufficient length of time to effect the plasticization of the rubber matrix and reduction of the average length of the carbon fibers followed by extrusion with a rubber extruder into a rod of 15 mm diameter. The average length of the carbon fibers embedded in the matrix of the rod was determined to be about 0.22 mm microscopically after dispersing a small fragment of the rod in toluene.

The rod was then subjected to curing by heating in an air oven at 250° C. for 10 minutes and the cured rod was sliced into disc sheets of varied thicknesses ranging from 0.2 mm to 1.2 mm. The orientation of the carbon fibers was satisfactorily in alignment in the direction perpendicular to the surface of the disc sheet as examined microscopically.

Each of the disc sheets thus prepared was placed on a 20 mm-diameter nickel-plated disc electrode and press-contacted with a flat-tipped pin-like nickel counterelectrode of 1.6 mm diameter at the center to exert a compressive force of certain strength and electric resistance between the disc electrode and the pin electrode was determined with varied contacting pressure applied. The results of the resistance measurement are summarized in the table below.

| Contacting pressure, $g/mm^2$ | Electric resistance between electrodes, ohm Thickness of disc sheet, mm | | | | | | |
|---|---|---|---|---|---|---|---|
| | 0.2 | 0.3 | 0.4 | 0.5 | 0.8 | 1.0 | 1.2 |
| 1 | 140 | 160 | 200 | 400 | * | * | * |
| 8 | 40 | 50 | 140 | 300 | * | * | * |
| 80 | 10 | 13 | 54 | 260 | 2000 | * | * |
| 200 | 3.6 | 7.4 | 20 | 200 | 600 | * | * |
| 500 | 2.4 | 5.6 | 14 | 140 | 200 | 100 | * |
| 800 | 2.0 | 100 | 40 | 140 | 200 | 300 | * |

In the above experiments, the disc sheets of 0.2 mm and 1.2 mm thickness were prepared for comparative purpose and the values denoted with the symbol (*) were too high to be determined with the instrument employed probably reaching an insulating resistance. It is noteworthy that the contacting pressure was increased beyond 500 $g/mm^2$, the electric resistance began again to increase though the mechanism for this reversed pressure-resistance relationship is unknown.

What is claimed is:

1. A contacting element comprising a contacting material sheet, said sheet comprising a matrix having substantially parallel first and second planar surfaces on each side and being of a compressible polymeric insulating material, a multiplicity of electrically conductive fibers disposed substantially perpendicular to each of said first and second surfaces and being uniformly distributed within said matrix but separated from each other by the insulating material of said sheet matrix, at least some of said fibers extending from one of said first surface to said second surface, at least some of said fibers being shorter than the space in between said first and second surfaces, said short fibers contributing little to the conductivity of the sheet in the uncompressed state, first and second electrode means each including at least one electrode aligned laterally with the corresponding electrode of the other and disposed in contact with said first and second surfaces respectively, and means supporting said first and second electrode means so that they can apply a contact pressure on said sheet matrix to cause the conduction of said sheet to be increased by compressing said sheet to close the gaps of said shorter fibers between said first and second electrodes.

2. A contacting element according to claim 1, wherein said first and second electrodes comprise electrically conductive cable assemblies having a multiplicity of cable wires terminating in a contact surface, and coupling means for coupling said cable wires together with said sheet matrix therebetween, said coupling means being tightenable to compress said sheet matrix.

* * * * *